United States Patent
Jian

(10) Patent No.: US 11,063,575 B2
(45) Date of Patent: Jul. 13, 2021

(54) BAND REJECT FILTERS

(71) Applicant: Telefonaktiebolaget LM Ericsson (publ), Stockholm (SE)

(72) Inventor: Chunyun Jian, Ottawa (CA)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 249 days.

(21) Appl. No.: 16/078,926

(22) PCT Filed: Apr. 5, 2016

(86) PCT No.: PCT/IB2016/051927
§ 371 (c)(1),
(2) Date: Aug. 22, 2018

(87) PCT Pub. No.: WO2017/144956
PCT Pub. Date: Aug. 31, 2017

(65) Prior Publication Data
US 2019/0058456 A1    Feb. 21, 2019

Related U.S. Application Data

(60) Provisional application No. 62/299,339, filed on Feb. 24, 2016.

(51) Int. Cl.
| | | |
|---|---|---|
| H03H 9/54 | (2006.01) |
| H03H 3/02 | (2006.01) |
| H03H 9/05 | (2006.01) |
| H03H 9/56 | (2006.01) |
| H03H 9/10 | (2006.01) |

(52) U.S. Cl.
CPC ........... *H03H 9/542* (2013.01); *H03H 3/02* (2013.01); *H03H 9/0514* (2013.01);
(Continued)

(58) Field of Classification Search
CPC .. H03H 9/0514; H03H 9/0523; H03H 9/0547; H03H 9/0557; H03H 9/1007;
(Continued)

(56) References Cited

U.S. PATENT DOCUMENTS 3,697,903 A * 10/1972 Sauerland ............. H03H 9/542
333/189
6,710,677 B2 * 3/2004 Beaudin ................ H03H 9/547
330/306
(Continued)

FOREIGN PATENT DOCUMENTS

| EP | 1 398 876 A1 | 3/2004 |
| JP | 2012-175438 A * | 9/2012 |
| WO | 2012/079038 A2 | 6/2012 |

OTHER PUBLICATIONS

English language machine translation of JP 2012-175438 A, published Sep. 10, 2012, 17 pages provided. (Year: 2012).*
(Continued)

*Primary Examiner* — Barbara Summons
(74) *Attorney, Agent, or Firm* — Sage Patent Group

(57) ABSTRACT

A method and a band reject filter (BRF) using as acoustic resonators at least one of bulk acoustic wave (BAW) resonators and film bulk acoustic resonators (FBAR) are provided. The BRF includes at least one substrate having at least one of a plurality of capacitors formed thereon, the plurality of capacitors having capacitances selected to achieve a particular band reject response. The BRF also includes at least one die. At least one of a plurality of acoustic wave resonators are formed thereon. The plurality of acoustic wave resonators are one of BAW resonators and FBARs and are designed to have the same resonant frequency. A plurality of conductors between the substrate and the die are positioned to electrically connect the acoustic wave resonators and the capacitors.

19 Claims, 8 Drawing Sheets

(52) U.S. Cl.
CPC ........ *H03H 9/0523* (2013.01); *H03H 9/0547* (2013.01); *H03H 9/0557* (2013.01); *H03H 9/1007* (2013.01); *H03H 9/547* (2013.01); *H03H 9/568* (2013.01)

(58) Field of Classification Search
CPC ........ H03H 9/542; H03H 9/547; H03H 9/568; H03H 3/02
USPC ......................................................... 333/189
See application file for complete search history.

(56) References Cited

U.S. PATENT DOCUMENTS

| | | | | |
|---|---|---|---|---|
| 7,525,400 | B2* | 4/2009 | Carpentier | H03H 9/58 333/189 |
| 2005/0099244 | A1* | 5/2005 | Nakamura | H03H 9/02118 333/133 |
| 2006/0055488 | A1* | 3/2006 | Ten Dolle | H03H 9/0028 333/190 |
| 2009/0128260 | A1 | 5/2009 | Block et al. | |
| 2010/0091473 | A1 | 4/2010 | Kiwitt et al. | |

OTHER PUBLICATIONS

International Search Report and Written Opinion of the International Searching Authority dated Nov. 18, 2016 issued in corresponding PCT Application Serial No. PCT/IB2016/051927, consisting of 14 pages.

* cited by examiner

BAND REJECT FILTERS

CROSS-REFERENCE TO RELATED APPLICATIONS

This application is a Submission Under 35 U.S.C. § 371 for U.S. National Stage Patent Application of International Application Number: PCT/IB2016/051927, filed Apr. 5, 2016 entitled "BAND REJECT FILTERS," which claims priority to U.S. Provisional Application No. 62/299,339, filed Feb. 24, 2016, entitled "BAND REJECT FILTERS," the entireties of both of which are incorporated herein by reference.

TECHNICAL FIELD

This disclosure relates to band reject filters.

BACKGROUND

Band reject filters (BRFs) are used in devices such as wireless networks base stations and wireless devices to combat interference encountered on co-location/co-site radio deployments, as well as on multi-band radio designs. In particular, demand for BRFs that are small in size, light in weight and low in cost is very strong, because of interference that occurs in cell networks such as fourth generation (4G) small cell networks.

Typically, BRFs used to mitigate interference require a steep transition band between the passband and the reject band. To achieve BRFs with such steep transition bands, a high Q resonator is desired. Surface acoustic wave (SAW) resonators have a relatively high Q of about 1000 around a 1 giga-Hertz (GHz) resonance frequency. The Q of a SAW resonator drops to about 500 when its resonance frequency is up to 2 GHz. Since a Q of 500 is not high enough to meet BRF filtering requirements in wireless networks applications, the SAW resonator-based BRF is useful to counter interference within a frequency range of 0.5 to 1.5 GHz.

Bulk acoustic wave (BAW) resonators and film bulk acoustic resonators (FBAR) are high Q devices that may be used in BRFs. They have much higher Q than SAW resonators. For example, a BAW resonator or FBAR may have a Q as high as 3000 at 2 GHz, and even show a Q of about 2000 at a frequency of 3 GHz. Thus, from the standpoint of high Q, both the BAW resonator and the FBAR are desirable.

However, the BAW resonator and the FBAR have very complicated manufacturing processes in comparison to a SAW resonator and are up to 50-100 times more expensive to design than SAW resonators. Such large expense is a chief reason why BAW resonators and FBARs are not widely used in wireless networks base stations designs because of their small amount of needs.

SUMMARY

Some embodiments advantageously provide band reject filters and the design thereof. According to one aspect, a band reject filter (BRF) using as acoustic resonators at least one of bulk acoustic wave (BAW) resonators and film bulk acoustic resonators (FBAR) is provided. The BRF includes at least one substrate having at least one of a plurality of capacitors formed thereon, the plurality of capacitors having capacitances selected to achieve a particular band reject response. The BRF also includes at least one die. At least one of a plurality of acoustic wave resonators are formed on the at least one die. Each of the plurality of acoustic wave resonators are one of BAW resonators and FBARs and designed to have the same resonant frequency. A plurality of conductors between the at least one substrate and the at least one die are positioned to electrically connect the acoustic wave resonators and the capacitors.

According to this aspect, in some embodiments, the at least one substrate, the at least one die, acoustic wave resonators, capacitors and conductors are enclosed in a sealed package. In some embodiments, the conductors are solder balls or gold bumps. In some embodiments, there are n resonators electrically in parallel and there are m resonators electrically in series, n and m being integers. In some embodiments, each of the n resonators are electrically in series with a capacitor. In some embodiments, each of the m resonators are electrically in parallel with a capacitor. In some embodiments, the BRF includes a plurality of inductors electrically in parallel with the n resonators. In some embodiments, each of the plurality of capacitors is an interdigital-type capacitor with a number of fingers selected to adjust a capacitance of the capacitor. In some embodiments, the capacitances are chosen to compensate for a deviation of an acoustic wave resonator from the designed resonant frequency.

According to another aspect, a band reject filter IC is provided. The BRF includes at least one die. The BRF also includes a plurality of acoustic wave resonators, the plurality of acoustic wave resonators being one of BAW, resonators and FBARs. The plurality of acoustic wave resonators are formed on the at least one die and are designed to have the same resonant frequency. The BRF also includes at least one substrate and formed on the at least one substrate, a plurality of capacitors, the plurality of capacitors having capacitances selected to achieve a particular band reject response. Electrical conductors positioned between the at least one die and the at least one substrate electrically connect the capacitors on the at least one substrate to at least one acoustic wave resonators on the at least one die.

According to this aspect, in some embodiments, the at least one substrate, the at least one die, the acoustic wave resonators and the conductors are enclosed in a sealed package. In some embodiments, the conductors are solder balls or gold bumps. In some embodiments, are n resonators electrically in parallel and there are m resonators electrically in series, n and m being integers. In some embodiments, each of the n resonators are electrically in series with a capacitor. In some embodiments, each of the m resonators are electrically in parallel with a capacitor. In some embodiments, the BRF IC includes a plurality of inductors electrically in parallel with the n resonators. In some embodiments, each of the plurality of capacitors is an interdigital-type capacitor with a number of fingers selected to adjust a capacitance of the capacitor. In some embodiments, the capacitances are chosen to compensate for a deviation of an acoustic wave resonator from the designed resonant frequency According to yet another aspect, a method of manufacturing a band reject filter, BRF, is provided. The method includes forming a plurality of acoustic wave resonators on a die, each of the plurality of acoustic resonators being designed to have the same resonant frequency, each acoustic wave resonator being one of bulk acoustic wave, BAW, resonators and film bulk acoustic resonators, FBAR. Capacitors are formed on a substrate. The capacitors have capacitances chosen to achieve a particular band reject response. A flip-chip manufacturing technique is employed to mate the die and the substrate with solder balls or gold bumps to electrically connect the capacitors on the substrate to at least one corresponding acoustic resonator on the die.

According to this aspect, the method also includes sealing the die, the substrate, the acoustic wave resonators and the capacitors in an integrated circuit package. In some embodiments, each of the plurality of capacitors is an interdigital-type capacitor with a number of fingers selected to adjust a capacitance of the capacitor. In some embodiments, the method further includes packaging the at least one substrate, the at least one die, acoustic wave resonators, capacitors and conductors in a sealed integrated circuit package. In some embodiments, the capacitances are chosen to compensate for a deviation of an acoustic wave resonator from the designed resonant frequency.

BRIEF DESCRIPTION OF THE DRAWINGS

A more complete understanding of the present embodiments, and the attendant advantages and features thereof, will be more readily understood by reference to the following detailed description when considered in conjunction with the accompanying drawings wherein.

DETAILED DESCRIPTION

Figure 1:
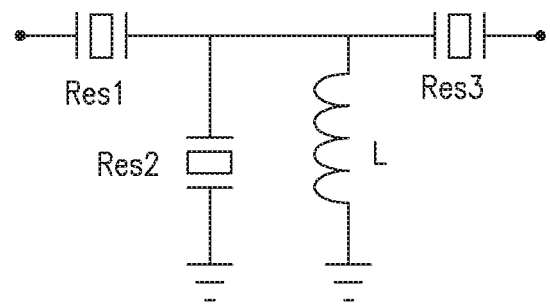
FIG. 1 is a schematic diagram of a known band reject filter (BRF)

Before describing in detail exemplary embodiments, it is noted that the embodiments reside primarily in combinations of apparatus components and processing steps related to band reject filter implementation. Accordingly, components have been represented where appropriate by conventional symbols in the drawings, showing only those specific details that are pertinent to understanding the embodiments so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

Figure 2:
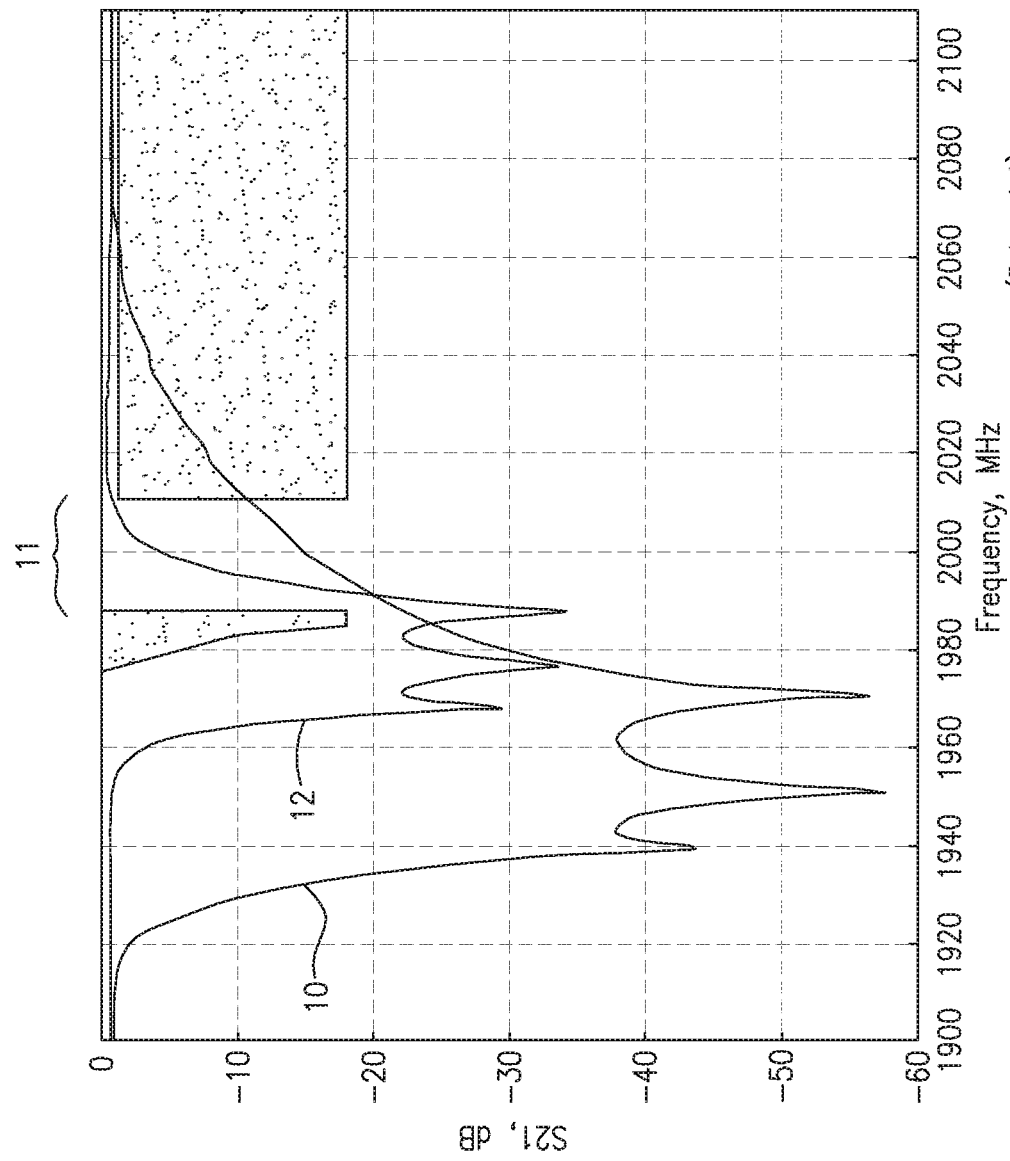
FIG. 2 is a graph of band reject responses for the BRFs shown in FIGS. 1 and 3.

FIG. 1 is a schematic diagram of a typical BRF design using acoustic resonators. Each of the three different resonators of FIG. 1 is designed to have a different resonance frequency to form the width of the band reject region, as shown in FIG. 2 curve 10. For a BAW resonator or an FBAR, a different resonance frequency means a different design for each resonator. A different design requires a different combination of thicknesses of an active piezoelectric layer and mass loading metal layer. To change the thickness of these layers, a certain number of processing steps in sequence are needed for the manufacture of the resonator, which results in increased cost.

Figure 3:
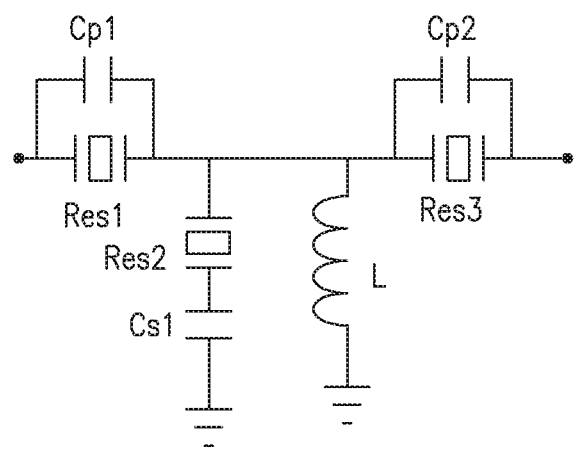
FIG. 3 is a schematic diagram of a known BRF with tuning capacitors.

Currently, only one piezoelectric material is used for the design of BAW resonators and FBARs, which is aluminum nitride (AlN). Such resonators have an electromechanical coupling coefficient of about 6 or 6.5%. For some BRF designs, such values are too high and must be reduced by use of capacitors, so that a sharp transition band can be designed. This is shown in FIG. 3 where capacitors, Cp1 and Cp2, are placed in parallel with the two series resonators, Res1 and Res3, and a capacitor, Cs1, is placed in series with the parallel resonator, Res2.

As shown in FIG. 2, curve 10, the stopband region of the BRF band reject response of the circuit of FIG. 1 has three valleys, one for each of the three different resonators of the BRF of FIG. 1. A sharper transition region can be achieved using the capacitors shown in the circuit of FIG. 3. This sharper transition region is shown as curve 12 of FIG. 2. Note that in FIG. 2, the area 11 between the shaded regions is a transition region of the band reject response.

Figure 4:
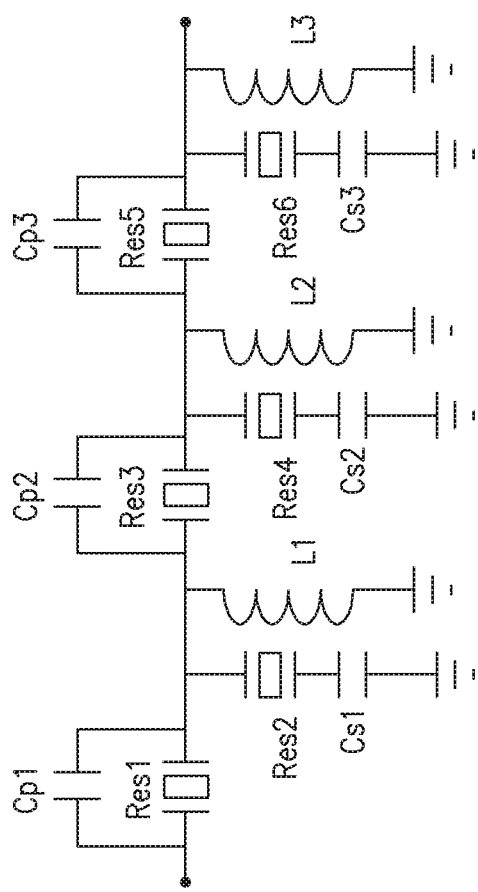
FIG. 4 is a schematic of a known BRF having six differently designed acoustic resonators.
Figure 5:
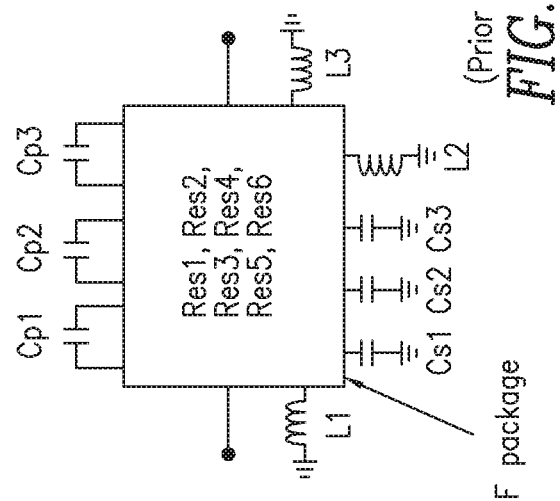
FIG. 5 is an illustration of a known package including the six differently designed acoustic resonators.

A more general BRF design is shown in FIG. 4. The design shown in FIG. 4 has six different resonators and six capacitors. As shown in FIG. 5, conventionally, the six resonators are included in a package and the capacitors and matching inductors are added as peripheral components outside the package. The placement of the capacitors peripheral to the package results in the consumption of large spaces of the printed circuit board on which the package is placed.

In summary, conventional designs using BAW resonators and FBARs are expensive, involving the design of many different resonators, and use of large board space for peripheral components. Also, since the placement of the different resonant frequencies of the resonators may be critical, repeated manufacture may be required to achieve a critical resonant frequency and/or transition region, thereby increasing the cost of manufacture even further.

Figure 6:
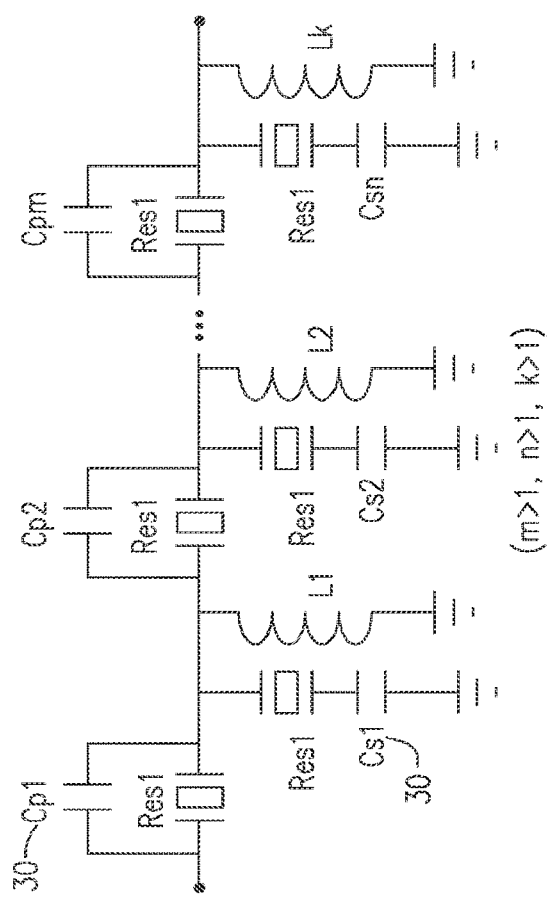
FIG. 6 is a schematic diagram of a BRF according to methods presented herein.

To address the above, embodiments of the present disclosure provide BRFs using BAW resonators and FBARs, and design methodologies for the design of BRFs using BAW resonators and FBARs, which reduce design costs, manufacturing costs and size as compared with known BRFs. FIG. 6 is a schematic of a design in which all the acoustic resonators are designed to have the same resonant frequency. Rather than design a different resonator for each resonator section of the BRF circuit to achieve different valleys within the band reject region, each of the resonators, Res1, of the BRF are designed to resonate at the same frequency, and the width of the band reject region is achieved by selection of the capacitors Cp1-Cpm and Cs1-Csn, where there are m series resonators and n parallel resonators. Each of the m series resonators has a capacitor Cp electrically in parallel with the corresponding resonator and each of the n parallel resonators has a capacitor Cs electrically in series with the corresponding resonator. Capacitors Cp and Cs are referred to herein collectively as capacitors 30.

By using the same design for each resonator in the BRF, substantial design and manufacturing costs may be avoided. The capacitances of the capacitors may be chosen to compensate for a deviation of an acoustic wave resonator from the designed resonant frequency. In some embodiments, each capacitor may be an interdigital-type capacitor with a number of fingers selected to adjust a capacitance of the capacitor. In some embodiments, the capacitors are formed on a high Q substrate.

Figure 7:
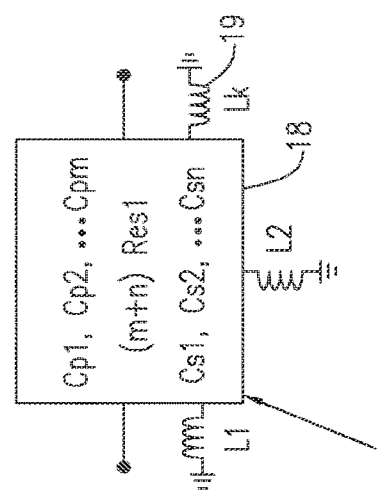
FIG. 7 is an illustration of a BRF package according to methods described herein.

FIG. 7 is an illustration of a BRF in a BRF package 18 that includes not only the n+m resonators having the same design, but also include the n+m capacitors as well. Including the capacitors in the BRF package 18 with the resonators substantially reduces the amount of board space utilized for peripheral components. Note that the matching inductors 19 remain outside the BRF package 18 in some embodiments. In one embodiment, the BRF package is an integrated circuit (IC), also referred to herein as a BRF IC.

Figure 8:
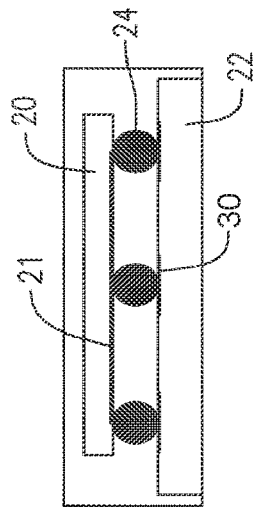
FIG. 8 is an illustration of an assembly of a BRF using a flip-chip technology according to methods described herein.

FIG. 8 is an illustration of an example showing how the resonators and capacitors may be integrated in the same BRF package 18 using flip chip technology. All of the resonators 21 in the BRF package 18 may be formed on a single die 20, and all of the capacitors 30 may be formed on a single substrate 22. Connections between the capacitors 30 and resonators 21 may be formed using metal bumps 24, which may be solder balls or gold bumps, for example. Note that an exterior surface of the die 20 or the substrate 22 may form a surface of the BRF package 18 or the entire die 20 and/or substrate 22 may be fully enclosed within the BRF package 18.

Thus, some embodiments include a BRF using as acoustic resonators at least one of BAW resonators and FBARs. The BRF includes a substrate and a die. A plurality of acoustic wave resonators are formed on the die. The plurality of acoustic resonators are of the same designed resonant frequency. A plurality of capacitors are formed on the substrate. The plurality of capacitors have capacitances selected to achieve a particular band reject response. Electrical conductors, such as metal bumps or solder balls or gold bumps lie between the die and the substrate and are positioned to electrically connect the acoustic wave resonators and the capacitors. In one embodiment, the components of the BRF may be a sealed package such as in an integrated circuit (IC) package. In some embodiments, the acoustic wave resonators may be formed on more than one die, and the capacitors may be formed on more than one substrate. The acoustic wave resonators, the capacitors, the substrate(s) and the die(s) may be packaged in a sealed integrated circuit package.

Figure 9:
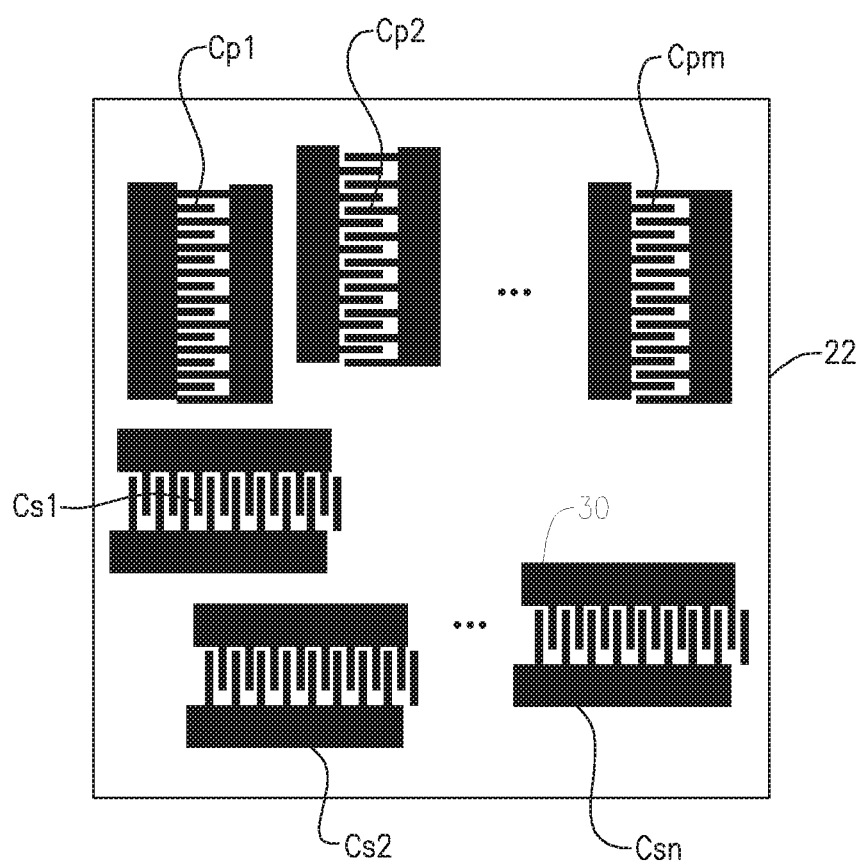
FIG. 9 is an illustration of interdigital capacitors on a substrate that may be integrated with a BRF according to method described herein.

FIG. 9 is an illustration of capacitors 30 formed on a dielectric substrate 22 such as an alumina substrate, $Al_2O_3$, or single crystal or multi-crystal substrates such as Quartz, LiNbO3, LiTaO3, sapphire, silicon, as well as some printed circuit board (PCB) materials such as FR-4 and Rogers, etc. In one embodiment, the dielectric materials used may have small loss tangent to allow the capacitors to have Q values high enough to achieve a desired band reject transition region. Note that the capacitors may be aligned symmetrically or placed in an asymmetric pattern, as desired.

Electrode patterns of the capacitors 30 (Cp1 . . . Cpm and Cs1 . . . Csn) on the substrate 22 may be any shape but an interdigital pattern as shown in FIG. 9 may be used. This type of capacitor can be manufactured to within 0.01 pico-Farad (pF) of capacitance. The interlaced fingers of the interdigital capacitor 30 may have any desired pitch (spacing) except that when a SAW substrate, such as, quartz or LiTaO3 is used, the pitch of the interdigital capacitor should be a value that is substantially different from a value of $p=v/(2fo)$, where v is velocity of propagation of the SAW (surface acoustic wave) along a direction perpendicular to the fingers of the interdigital capacitor and fo is the center frequency of the reject band of the BRF. This condition avoids generation of a surface acoustic wave on the substrate when signals within the reject band are passing through the capacitor.

Figure 10:
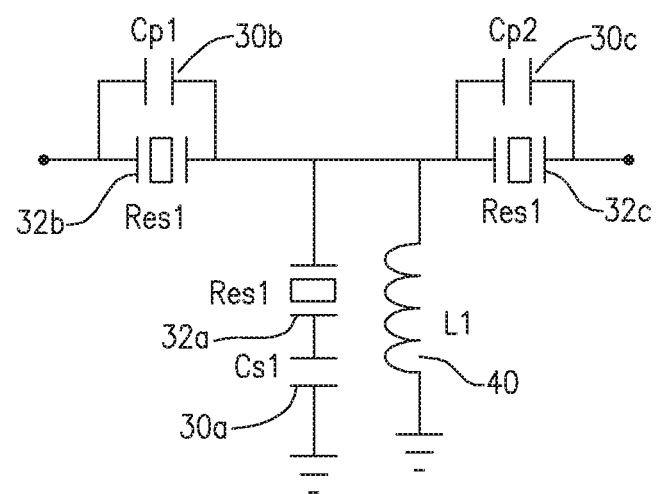
FIG. 10 is a schematic diagram of a BRF according to method presented herein.
Figure 11:
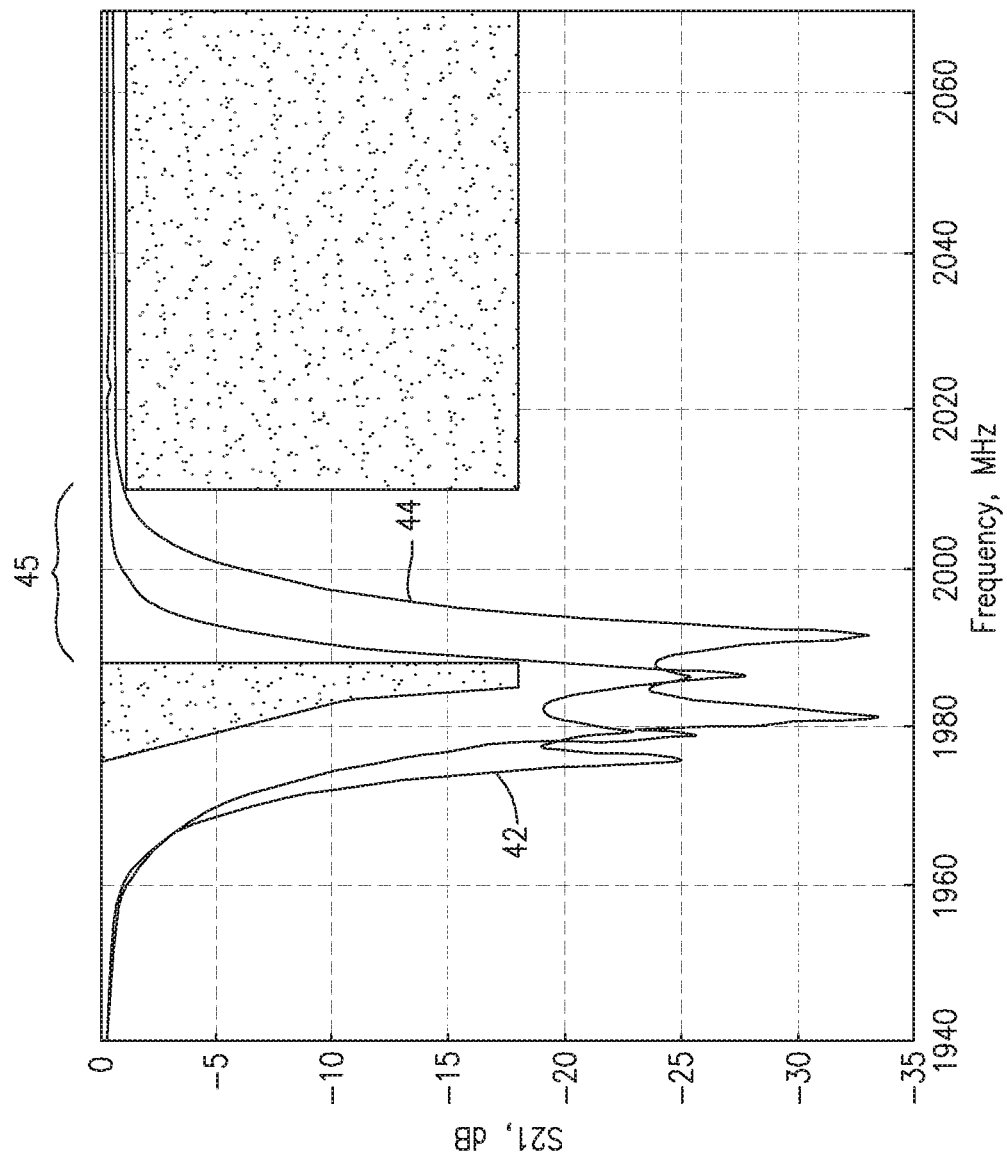
FIG. 11 is a graph of two band reject responses resulting from two different BRF designs using the same resonators.

FIG. 10 is a schematic diagram of a BRF with three resonators 32a, 32b and 32c (collectively "resonators 32"), all designed to have the same resonant frequency. Electrically parallel with the series resonators 32b and 32c are capacitors 30b and 30c. In electrical series with the electrically parallel resonator 32a is a capacitor 30a. Electrically in parallel with the electrically parallel resonator 32a is a matching inductor 40. Of course, implementations are not limited to the arrangement shown in FIG. 10. Other quantities of resonators and capacitors may be used. FIG. 11 is a graph of two band reject responses 42 and 44. Response 42 corresponds to the circuit of FIG. 10 when the components have the following values:

Cp1=1.28 pF, Cp2=1.60 pF, Cs1=0.70 pF, L1=4.3 nH

Response 44 corresponds to the circuit of FIG. 10 when the components have the following values:

Cp1=0.73 pF, Cp2=1.04 pF, Cs1=0.46 pF, L1=4.3 nH

Note that in FIG. 11, the area between the shaded regions is a transition region 45 of the band reject responses 42 and 44. Note also that the values of the capacitances and inductor are not difficult to achieve. In particular, the capacitors may be formed using photolithography.

FIGS. 10 and 11 show that the same resonators Res1 with different capacitances can achieve quite different band reject responses. In other words, all the resonators can be designed to have the same resonant frequencies and the valleys in the band reject response can be adjusted by varying the capacitors of the circuit. Thus, not only is the cost of design reduced because the same design can be used for all the resonators, but the manufacturing tolerances on the resonator design may not be critical since the response can be fine-tuned by varying the capacitors. Implementing capacitors of varied capacitances can be done at a low cost.

Therefore, embodiments include a method of manufacturing a band reject filter using BAW resonators or FBARs that is simple and low in cost. First, a plurality of acoustic wave resonators are formed on a die. Each of the resonators are of a same design, namely designed to have a same resonant frequency. Capacitors are chosen having capacitances to achieve a particular band reject response. Capacitors having the chosen capacitances are formed on a substrate. Flip chip technology can be used to mate the die and the substrate with solder balls or gold bumps forming connections between the capacitors and the acoustic resonators. The assembled die and substrate can be enclosed in a sealed integrated circuit (IC) package.

Figure 12:
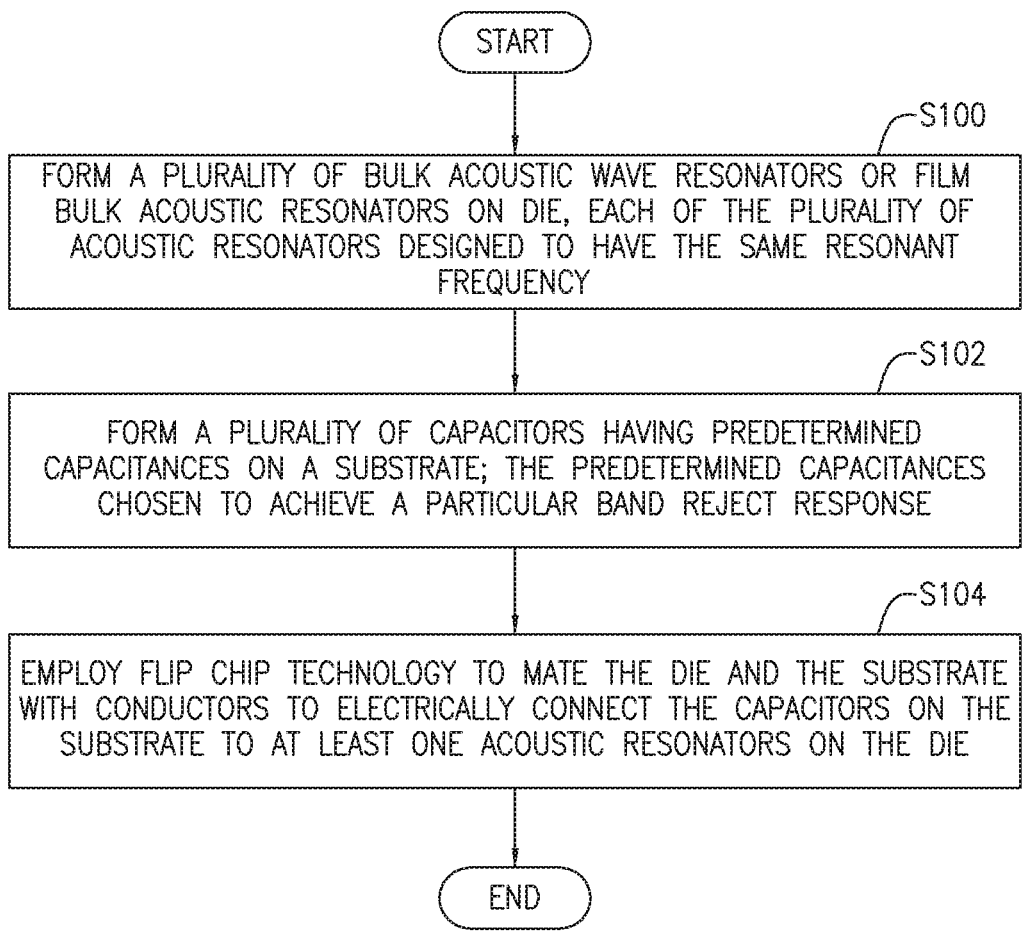
FIG. 12 is a flowchart of an exemplary process for design of a BRF according to methods described herein.

FIG. 12 is a flowchart of an exemplary process for manufacturing a band reject filter, BRF, using acoustic wave resonators chosen from a group consisting of bulk acoustic wave, BAW, resonators and film bulk acoustic resonators, FBAR. The method includes forming a plurality of acoustic wave resonators on a die, each of the plurality of acoustic resonators having the same resonant frequency (block S100). The capacitors are formed on a substrate and have a predetermined capacitance chosen to achieve a particulate band reject response (block S102). A flip-chip manufacturing technique is employed to mate the die and the substrate with solder balls or gold bumps to electrically connect the capacitors on the substrate to at least one acoustic resonator on the die (block S108).

The embodiments described herein enable a filter designer to design a relatively low-cost BRF using BAW resonators or FBARs with a short design time. The BRFs described herein can be used in embodiments such as base stations and hand held wireless devices. Since BRFs using BAW resonators and FBARs have much better filtering performance than SAW resonators, BRFs using BAW resonators and FBARs can be expected to help network operators use their valuable spectrum resources more efficiently.

As will be appreciated by one of skill in the art, the concepts described herein may be embodied as a method, data processing system, and/or computer program product. Accordingly, the concepts described herein may take the form of an entirely hardware embodiment, an entirely software embodiment or an embodiment combining software and hardware aspects all generally referred to herein as a "circuit" or "module." Furthermore, the disclosure may take the form of a computer program product on a tangible computer usable storage medium having computer program code embodied in the medium that can be executed by a computer. Any suitable tangible computer readable medium may be utilized including hard disks, CD-ROMs, electronic storage devices, optical storage devices, or magnetic storage devices.

Some embodiments are described herein with reference to flowchart illustrations and/or block diagrams of methods, systems and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable memory or storage medium that can direct a computer or other programmable data processing apparatus to function in a particular manner, such that the instructions stored in the computer readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Computer program code for carrying out operations of the concepts described herein may be written in an object oriented programming language such as Java® or C++. However, the computer program code for carrying out operations of the disclosure may also be written in conventional procedural programming languages, such as the "C" programming language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

It will be appreciated by persons skilled in the art that the embodiments described herein are not limited to what has been particularly shown and described herein above. In addition, unless mention was made above to the contrary, it should be noted that all of the accompanying drawings are not to scale. A variety of modifications and variations are possible in light of the above teachings without departing from the scope of the following claims.

What is claimed is:

1. A band reject filter, BRF, the BRF comprising:
    at least one substrate, the at least one substrate having at least one of a plurality of capacitors formed thereon, the plurality of capacitors having capacitances selected to achieve a particular band reject response;
    at least one die, the at least one die having at least one of a plurality of acoustic wave resonators formed thereon, the plurality of acoustic wave resonators being one of bulk acoustic wave, BAW, resonators and film bulk acoustic resonators, FBAR, and each of the plurality of acoustic wave resonators being designed to have a same resonant frequency, wherein there are n resonators electrically in parallel and there are m resonators electrically in series, n and m being integers; and
    a plurality of conductors between the at least one substrate and the at least one die and positioned to electrically connect the acoustic wave resonators and the capacitors.

2. The BRF of claim 1, wherein the at least one substrate, the at least one die, acoustic wave resonators, capacitors and conductors are enclosed in a sealed package.

3. The BRF of claim 1, wherein the conductors are solder balls or gold bumps.

4. The BRF of claim 1, wherein each of the n resonators are electrically in series with a capacitor.

5. The BRF of claim 1, wherein each of the m resonators are electrically in parallel with a capacitor.

6. The BRF of claim 1, further comprising a plurality of inductors electrically in parallel with the n resonators.

7. The BRF of claim 1, wherein each of the plurality of capacitors is an interdigital-type capacitor with a number of fingers selected to adjust a capacitance of the capacitor.

8. The BRF of claim 1, wherein the capacitances are chosen to compensate for a deviation of an acoustic wave resonator from the resonant frequency.

9. A band reject filter, BRF, integrated circuit, IC, comprising:
   at least one die;
   a plurality of acoustic wave resonators, the plurality of acoustic wave resonators being one of bulk acoustic wave, BAW, resonators and film bulk acoustic resonators, FBAR, the plurality of acoustic wave resonators being formed on the at least one die and being designed to have a same resonant frequency, wherein there are n resonators electrically in parallel and there are m resonators electrically in series, n and m being integers;
   at least one substrate;
   a plurality of capacitors, the plurality of capacitors being formed on the at least one substrate and having capacitances selected to achieve a particular band reject response; and
   electrical conductors positioned between the at least one die and the at least one substrate, the electrical conductors arranged to electrically connect the capacitors on the at least one substrate to at least one corresponding acoustic wave resonator on the at least one die.

10. The BRF IC of claim 9, wherein the at least one substrate, the at least one die, the acoustic wave resonators and the conductors are enclosed in a sealed package.

11. The BRF IC of claim 9, wherein the electrical conductors are solder balls or gold bumps.

12. The BRF IC of claim 9, wherein each of the n resonators are electrically in series with a capacitor.

13. The BRF IC of claim 9, wherein each of the m resonators are electrically in parallel with a capacitor.

14. The BRF IC of claim 9, further comprising a plurality of inductors electrically in parallel with the n resonators.

15. The BRF IC of claim 9, wherein each of the plurality of capacitors is an interdigital-type capacitor with a number of fingers selected to adjust a capacitance of the capacitor.

16. The BRF IC of claim 9, wherein the capacitances are chosen to compensate for a deviation of an acoustic wave resonator from the resonant frequency.

17. A method of manufacturing a band reject filter, BRF, the method comprising:
   forming a plurality of acoustic wave resonators on a die, each of the plurality of acoustic resonators being one of bulk acoustic wave, BAW, resonators and film bulk acoustic resonators, FBAR, each of the acoustic wave resonators being designed to have a same resonant frequency;
   forming a plurality of capacitors having predetermined corresponding capacitances on a substrate, the capacitances of capacitors being chosen to achieve a particular band reject response, wherein the capacitances are chosen to compensate for a deviation of an acoustic wave resonator from the designed resonant frequency; and
   employing a flip-chip manufacturing technique to electrically mate the die and the substrate using solder balls or gold bumps to electrically connect the capacitors on the substrate to at least one corresponding acoustic wave resonator on the die.

18. The method of claim 17, further comprising sealing the die, the substrate, the acoustic wave resonators and the capacitors in an integrated circuit package.

19. The method of claim 17, wherein each of the plurality of capacitors is an interdigital-type capacitor with a number of fingers selected to adjust a capacitance of the capacitor.

* * * * *